United States Patent
Tzivanopoulos et al.

(10) Patent No.: US 12,461,155 B2
(45) Date of Patent: Nov. 4, 2025

(54) MONITORING ASSEMBLY FOR AN ELECTRICAL COMPONENT, SEMICONDUCTOR SWITCH ASSEMBLY HAVING A MONITORING FUNCTION, AND ENERGY SYSTEM

(71) Applicant: Robert Bosch GmbH, Stuttgart (DE)

(72) Inventors: Chrysanthos Tzivanopoulos, Grossbettlingen (DE); Johannes Swoboda, Stuttgart (DE); Mathis Wolf, Kornwestheim (DE); Patrick Kaupp, Stuttgart (DE); Thomas Schaedlich, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 18/558,607

(22) PCT Filed: Apr. 25, 2022

(86) PCT No.: PCT/EP2022/060800
§ 371 (c)(1),
(2) Date: Nov. 2, 2023

(87) PCT Pub. No.: WO2022/238093
PCT Pub. Date: Nov. 17, 2022

(65) Prior Publication Data
US 2024/0230761 A1    Jul. 11, 2024

(30) Foreign Application Priority Data
May 11, 2021   (DE) .................... 10 2021 204 762.9

(51) Int. Cl.
*G01R 31/327*   (2006.01)
*G01R 15/04*    (2006.01)
*H03K 17/687*   (2006.01)

(52) U.S. Cl.
CPC ......... *G01R 31/3277* (2013.01); *G01R 15/04* (2013.01); *H03K 17/687* (2013.01)

(58) Field of Classification Search
CPC .. G01R 31/3277; G01R 15/04; H03K 17/687; H03K 17/122; H03K 17/6874; H03K 2217/0027; H03K 17/18
See application file for complete search history.

(56) References Cited

U.S. PATENT DOCUMENTS 5,789,902 A      8/1998  Abe et al.
10,498,135 B2 *  12/2019 Zhang .................... H01H 9/548
(Continued)

FOREIGN PATENT DOCUMENTS

DE         2427785 A1   12/1975
DE    102018222554 A1    6/2020
(Continued)

OTHER PUBLICATIONS

Translation of International Search Report for Application No. PCT/EP2022/060800 dated Jul. 15, 2022 (2 pages).

*Primary Examiner* — Lee E Rodak
*Assistant Examiner* — Zannatul Ferdous
(74) *Attorney, Agent, or Firm* — Michael Best & Friedrich LLP

(57) ABSTRACT

The invention relates to a monitoring assembly for an electrical component, a semiconductor switch assembly having a monitoring function, and an energy system. An analysis unit (50) of the semiconductor switch assembly is configured to determine on the basis of a first voltage divider (20), a second voltage divider (25), and a measuring device (40), a short circuit and/or a deviation from desired switched states in a first semiconductor switch (10) having a first inverse diode and a second semiconductor switch (15) having a second inverse diode, the semiconductor switches (10, 15) being connected in series between an input terminal (Continued)

(30) and an output terminal (32) of the semiconductor switch assembly, in such a way that the inverse diodes thereof are arranged anti-serially. In addition, the semiconductor switch assembly is configured to determine, on the basis of a first switch (S1) and a second switch (S2), a corrective factor for establishing a balance between the first voltage divider (20) and the second voltage divider (25).

11 Claims, 1 Drawing Sheet

(56) References Cited

U.S. PATENT DOCUMENTS

| | | |
|---|---|---|
| 2015/0198635 A1 | 7/2015 | Shao et al. |
| 2020/0021182 A1* | 1/2020 | Kao ................... H02M 1/325 |
| 2021/0088598 A1* | 3/2021 | Maekawa ............. G01R 31/52 |
| 2021/0175881 A1* | 6/2021 | Sute ................. H03K 17/0822 |

FOREIGN PATENT DOCUMENTS

| | | |
|---|---|---|
| EP | 3489707 A1 | 5/2019 |
| WO | 2020216486 A1 | 10/2020 |

* cited by examiner

MONITORING ASSEMBLY FOR AN ELECTRICAL COMPONENT, SEMICONDUCTOR SWITCH ASSEMBLY HAVING A MONITORING FUNCTION, AND ENERGY SYSTEM

BACKGROUND

The invention relates to a monitoring assembly for an electrical component, a semiconductor switch assembly having a monitoring function, and an energy system having such a semiconductor switch assembly.

From the prior art, energy systems such as electric drive systems of electrically driven vehicles are known, which comprise, for example, a traction battery and an electric drive motor. For example, electromechanical contactors are used to electrically connect and disconnect the traction battery from the drive motor, which are monitored for error states such as bonding and/or welding of electrical contacts by means of a diagnostic functionality. Such diagnostic functionalities are used, for example, when opening the contactors. Accordingly, if an error state is detected, it is possible to protect the electrical energy system by means of a suitable fault response.

It is also known to use MOSFETs in a so-called "back-to-back" arrangement in place of contactors to connect and disconnect electrical power sources and electrical consumers.

US20150198635A1 describes a device for measuring a voltage comprising a first circuit and a second circuit, wherein the first circuit is connected to one or more nodes and generates an adjustment signal based on a measurement, and wherein the second circuit is configured to generate a comparison signal based on a comparison of a first voltage and a third voltage.

SUMMARY

According to the disclosure, a monitoring assembly for an electrical component is proposed. The monitoring assembly comprises: an electrical component, which, for example, has an electronic switch (e.g., a bipolar transistor, a MOSFET, etc.) and/or an electromechanical switch (e.g., a relay, a contactor, etc.) and/or a semiconductor device such as a diode and/or a measuring resistor and/or an electric circuit, etc., a first voltage divider having a first resistor and a second resistor, a second voltage divider having a third resistor and a fourth resistor, a first switch, a second switch, which are, for example, semiconductor switches or electromechanical switches, an input terminal, an output terminal, a reference potential terminal, which is a ground connection of the monitoring assembly, for example, a measuring means, which is, for example, an A/D converter and an evaluation unit, wherein the analysis unit is configured as, for example, an ASIC, FPGA, processor, digital signal processor, microcontroller, or the like.

The electrical component is connected between the input terminal and the output terminal of the monitoring assembly.

Furthermore, the first voltage divider is connected between the input terminal and the reference potential terminal, the second voltage divider is connected between the output terminal and the reference potential terminal, the second switch is connected between the input terminal and the output terminal, and the first switch is connected between the input terminal and a connection point of the first voltage divider and the second switch. Alternatively, the second switch is connected between the output terminal and a connection point of the second voltage divider and the second switch. Further alternatively, it is possible to additionally arrange a third switch in the path in which the second switch is not arranged.

A first measurement connection of the measuring device is connected to a connection point of the third resistor and the fourth resistor of the second voltage divider, a second measurement connection of the measuring device is connected to a connection point of the first resistor and the second resistor of the first voltage divider, and the measuring device is arranged to measure a voltage at the first measurement connection and at the second measurement connection, respectively, and to transmit a result of the respective measurements to the analysis unit.

The analysis unit is finally configured to determine a corrective factor for a balance between the first voltage divider and the second voltage divider, while the first switch is opened and the second switch is closed by means of a control by the analysis unit, which is connected in terms of information technology to the first switch and the second switch. Furthermore, the analysis unit is configured to determine a state of the electrical component based on an evaluation of a voltage difference corrected by the corrective factor between the first measurement input and the second measurement input of the measuring device, while the first switch is closed by means of a control by the analysis unit and the second switch is opened.

The monitoring assembly according to the invention based on the configuration described above offers, among other things, the advantage that precise voltage differences, in particular also at higher voltage levels (e.g., 48 V or in the high-voltage range), can be measured between the input terminal and the output terminal in a simple and, in particular, cost-effective manner (since, for example, expensive instrumentation amplifiers and/or high-precision resistors can be dispensed with and/or calibration during production can be omitted), which enables particularly reliable monitoring of the electrical component to be monitored. A further important advantage results from the fact that precise voltage measurement can be carried out in the operational state of the electrical component or a higher-level system using the electrical component, as temperature-related resistance changes in the two voltage dividers caused by operation can be continuously compensated by means of continuously determined corrective factors.

Preferably, the first voltage divider and the second voltage divider are symmetrically designed with regard to their resistance values, such that the resistances of the first voltage divider and the second voltage divider, which are each connected to the reference potential terminal, have substantially the same resistance values and the other resistances of the two voltage dividers also have substantially the same resistance values. "Substantially" means that manufacturing-related tolerances of the resistance values are thereby included in corresponding resistances. Due to the correction of deviations in the resistance values between the voltage dividers according to the invention, it is also advantageously possible to use favorable resistances with higher tolerances as long as compensation for static and/or dynamic deviations from resistance values is not significantly affected by a predetermined maximum measurement range and/or a resolution of the measuring device. Alternatively or additionally, the monitoring assembly is arranged to monitor voltages up to 60 V, preferably up to 400 V, and particularly preferably up to 800 V.

In an advantageous embodiment of the present invention, a frequency of determining the corrective factor and/or measuring the voltage difference corrected by the corrective factor is adjusted depending on a rate of change of a voltage measured between the input terminal and the reference potential terminal and/or a current measured between the input terminal and the output terminal and/or a temperature in the region of the electrical component and/or an aging of the electrical component. This provides the advantage that a computational load and/or an energy consumption in the analysis unit according to the invention is low in the case of a low rate of change of the aforementioned variables, while ensuring that rapid changes of the aforementioned variables are always recorded using a higher measurement frequency, such that deviations of the resistance values of the two voltage dividers caused by these variables can be compensated before these deviations negatively impact a required or pre-defined accuracy of monitoring the two semiconductor switches.

In a further advantageous embodiment of the present invention, in the event of a determined error state of the electrical component, fault treatment is initiated using the analysis unit, which in particular causes electrical disconnection of the output terminal from the input terminal. Depending on the design of the electrical component, the disconnection is carried out on the basis of the electrical component itself (at least by means of a possibly still operable part of the electrical component) and/or by a further isolating device, which is configured to disconnect the input terminal and the output terminal independently of the electrical component. As an alternative to disconnecting the input terminal from the output terminal, it is also conceivable to reduce power drawn at the output terminal and/or to put a higher-level system in an emergency mode as soon as an error state is determined. In addition, based on the precise voltage measurement provided by the monitoring assembly according to the invention, it is possible to differentiate between non-critical failure conditions (e.g., failure conditions that do not lead to a critical temperature increase in the electrical component) from critical failure conditions within the electrical component, such that more differentiated failure responses can be carried out.

Preferably, the determination of the corrective factor is carried out only if a current between the input terminal and the output terminal exceeds a predefined current threshold value, so that a sufficient accuracy of the measurement is ensured due to the associated higher voltage drop across the electrical component or the associated higher voltage difference at the measuring device.

In a further advantageous embodiment of the present invention, at least one resistor of the first voltage divider and/or at least one resistor of the second voltage divider is arranged outside an area in which there is substantially uniform heating of the resistors of the two voltage dividers due to a substantially uniform ambient temperature. In other words, the monitoring assembly according to the invention allows a higher arrangement flexibility for the resistances of the two voltage dividers, because effects on the respective resistance values due to temperature differences between the respective resistances are in particular also compensable for such temperature differences due to the (sequential) calibration, that would lead to distorted measurement results in the prior art and which would accordingly reduce a reliability of a monitoring function based on a voltage divider not compensated according to the invention.

Preferably, the analysis unit is configured to always control the first switch and the second switch such that a short circuit between the input terminal and the output terminal is not produced via the first switch and the second switch at any time. This ensures, in particular when using the monitoring assembly according to the invention in connection with higher powers, that connections configured as measurement lines (i.e., lines and/or tracks designed for low powers) from and to the first and second switches are not damaged in the event of a short circuit via these measuring lines and the respective switches. Alternatively or additionally, the analysis unit is configured to open the first switch in response to a determination of a quiescent mode of a system using the monitoring assembly. As a result, it is possible to minimize a power consumption of a system using the monitoring assembly.

According to a second aspect of the disclosure, a semiconductor switch assembly with monitoring function is proposed, which comprises a monitoring assembly. The electrical component comprises a first semiconductor switch having a first inverse diode and a second semiconductor switch having a second inverse diode, wherein preferably the first semiconductor switch and the second semiconductor switch are MOSFETs, further preferably "normally closed" MOSFETs, and particularly preferably identically formed MOSFETs, without thereby restricting the semiconductor switches to the aforementioned characteristics. The first semiconductor switch and the second semiconductor switch are connected in series between the input terminal and the output terminal such that the first inverse diode and the second inverse diode are anti-serially connected (also referred to as a "back-to-back" arrangement). In addition, the first semiconductor switch and the second semiconductor switch are configured to allow and interrupt current flow between the input terminal and the output terminal based on a control. Due to the use of semiconductor switches with inverse diodes, both a unidirectional current flow (when one of the two semiconductor switches is open while the other is closed) and a bi-directional current flow (when both semiconductors are open) may be enabled. With regard to the arrangement of the two semiconductor switches, both a series circuit of the two semiconductor switches can be used, in which the two source terminals of the two semiconductor switches are connected to each other, and a series circuit in which the two drain connections of the two semiconductor switches are connected to each other. The first semiconductor switch and the second semiconductor switch are controlled, for example, by means of the analysis unit according to the invention or by means of a separate control unit. The features, feature combinations and the advantages resulting therefrom correspond to those described in connection with the first-mentioned aspect of the invention so clearly that, to avoid repetition, reference is made to the above descriptions.

Particularly advantageously, determining the state of the first semiconductor switch and/or the second semiconductor switch includes determining a short circuit present in the first semiconductor switch and/or the second semiconductor switch and/or a deviation of an actual switch state from a desired switch state of the first semiconductor switch and/or the second semiconductor switch. In a case in which the analysis unit itself is configured to control the first semiconductor switch and the second semiconductor switch, the analysis unit preferably uses internal status information representing the respective target switched states to determine deviations from the respective target switched states. In a case in which a control unit deviating from the analysis unit is configured to control the two semiconductor switches, the analysis unit preferably receives the status information about the respective target switched states from this control unit.

In a further advantageous embodiment of the present invention, at least one further series circuit is connected from a third semiconductor switch and a fourth semiconductor switch in parallel to the series circuit from the first semiconductor switch and the second semiconductor switch, such that higher powers can be switched than with only two semiconductor switches.

According to a third aspect of the present invention, an energy system is proposed, which is a semiconductor switch assembly as described above, a battery, in particular, a vehicle battery (e.g., a traction battery), which is connected between the input terminal and the reference potential terminal and an electrical consumer, in particular, an electrical consumer of a vehicle (e.g., a drive motor), connected between the output terminal and the reference potential terminal. Based on the semiconductor switch assembly according to the invention, such an energy system is configured to connect the battery and the electrical consumer and, for example, to disconnect from one another in an error state or a quiescent state, while reliably monitoring the functionality of respective semiconductor switches of the semiconductor switch assembly. The features, feature combinations and the advantages resulting therefrom correspond to those described in connection with the first and second aspect of the invention so clearly that, to avoid repetition, reference is made to the above descriptions.

BRIEF DESCRIPTION OF THE DRAWINGS

Embodiment examples of the invention are described in detail below with reference to the accompanying drawings. The figures show.

DETAILED DESCRIPTION

Figure 1:
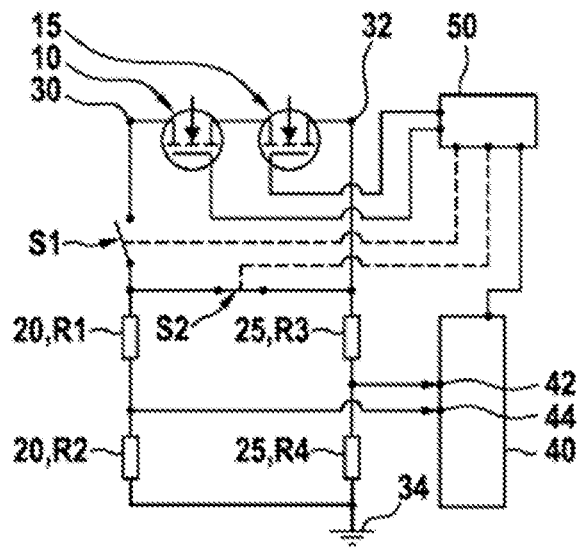
FIG. 1 a circuit diagram of a semiconductor switch assembly according to the invention according to a first embodiment.

FIG. 1 shows a schematic diagram of a semiconductor switch assembly according to the invention according to a first embodiment, which is configured on the basis of a monitoring assembly according to the invention. The semiconductor switch assembly has an input terminal 30, an output terminal 32, and a ground terminal 34. A first MOSFET 10 and a second MOSFET 15 are provided in a back-to-back arrangement between the input terminal 30 and the output terminal 32. The two MOSFETs 10, 15 are controlled by means of an analysis unit 50, which is electrically connected to respective control inputs of the two MOSFETs 10, 15. The semiconductor switch assembly also comprises a first voltage divider 20, which consists of a first resistor R1 and a second resistor R2 and a second voltage divider 25, which consists of a third resistor R3 and a fourth resistor R4. The resistance value of the first resistor R1 substantially corresponds to the resistance value of the third resistor R3 and the resistance value of the second resistor R2 substantially corresponds to the resistance value of the fourth resistor R4. In conjunction with a measuring device, which is configured here as an A/D converter 40, the two voltage dividers 20, 25 form a measurement bridge. For this purpose, the A/D converter 40 is electrically connected by means of a second measurement connection 44 to a connection point of the first resistor R1 and the second resistor R2 and by means of a first measurement connection 42 to a connection point of the third resistor R3 and the fourth resistor R4. Furthermore, the A/D converter 40 is connected in terms of information technology to the analysis unit 50 so that the analysis unit 50 is configured to receive information about respective voltage measurements of the A/D converter 40 at the first measurement connection 42 and at the second measurement connection 44. Furthermore, the semiconductor switch assembly comprises a first switch S1 and a second switch S2, whose respective control inputs are connected in terms of information technology to the analysis unit 50.

Based on the configuration described above, the semiconductor switch assembly is configured to perform a precise and continuously calibratable voltage measurement according to the above description, so that a reliable check of target switched states and any existing short circuits in the two MOSFETs 10, 15 can be checked on the basis of such a voltage measurement. The first switch S1 has an open state here, for example, while the second switch S2 has a closed state here, for example. The two voltage dividers 20, 25 are consequently at the same potential due to these states, so that the two voltage dividers 20, 25 can be balanced based on respective voltage measurements by the A/D converter 40.

In the event of a determined error state, it is possible, for example, to cause the input terminal 30 to be disconnected from the output terminal 32 by controlling the two MOSFETs 10, 15.

In addition, it is possible that a corrective factor used for the calibration of the voltage dividers 20, 25 is determined only if a predefined current threshold is exceeded by a current flowing between the input terminal 30 and the output terminal 32.

It is further possible that at least a part of the resistors R1, R2, R3, R4 is arranged separately from one another locally, as different temperature influences on the resistors R1, R2, R3, R4 are advantageously compensated by means of the semiconductor switch assembly according to the invention.

Preferably, the first switch S1 and the second switch S2 are always controlled such that a short circuit is not generated between the input terminal 30 and the output terminal 32 via the first switch S1 and the second switch S2 at any time, and that, in the event of an existing sleep mode, the first switch S1 is always opened using the semiconductor switch assembly.

Figure 2:
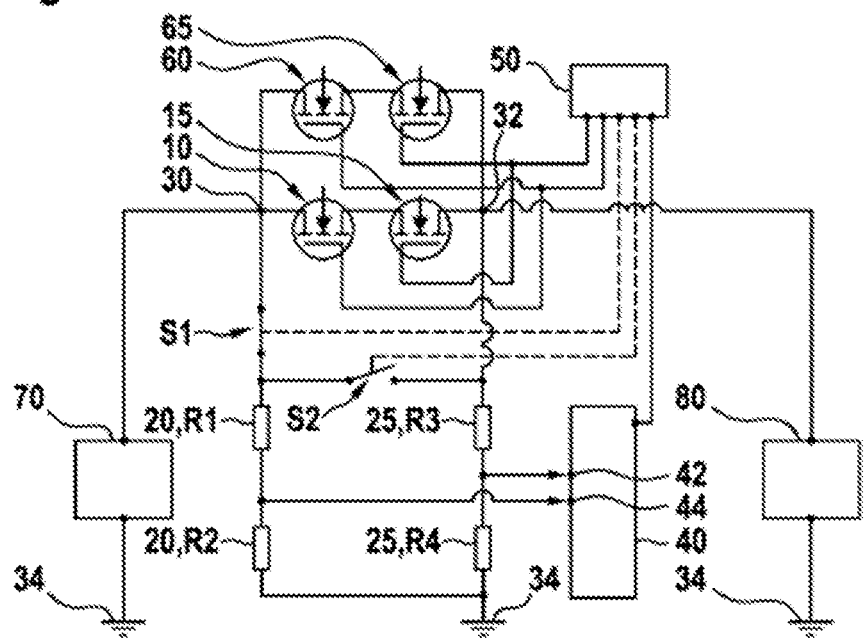
FIG. 2 a circuit diagram of an energy system according to the invention comprising a semiconductor switch assembly according to the invention according to a second embodiment.

FIG. 2 shows a circuit diagram of an energy system according to the invention comprising a semiconductor switch assembly according to the invention according to a second embodiment. The semiconductor switch assembly in FIG. 2 corresponds to a great extent to the semiconductor switch assembly described in FIG. 1, therefore, to avoid repetitions, only the differences to FIG. 1 are described below.

In FIG. 2, the semiconductor switch assembly according to the invention additionally comprises a third MOSFET 60 and a fourth MOSFET 65, which are also provided in a "back-to-back" arrangement and which are connected parallel to the series connection from the first MOSFET 10 and the second MOSFET 15. The MOSFETs 60, 65 are also controlled by the analysis unit 50. This allows higher power switching than in the first embodiment of the semiconductor switch assembly shown in FIG. 1.

Furthermore, in FIG. 2, an example of a closed state of the first switch S1 and an example of a closed state of the second switch S2, such that in this state, a determination of an input voltage between the input terminal 30 and the ground terminal 34 and an output voltage between the output terminal 32 and the ground terminal 34 is possible based on the balanced voltage dividers 20, 25 or the determined corrective factor.

The energy system, which is an energy system of an electrically driven vehicle here, comprises a traction battery 70 connected between the input terminal 30 and the ground terminal 34 and a drive motor 80 connected between the output terminal 32 and the ground terminal 34.

The invention claimed is:

1. A monitoring assembly for an electrical component comprising:
   an electrical component (10, 15),
   a first voltage divider (20) having a first resistor (R1) and a second resistor (R2),
   a second voltage divider (25) having a third resistor (R3) and a fourth resistor (R4),
   a first switch (S1),
     a second switch (S2),
     an input terminal (30),
     an output terminal (32),
     a reference potential terminal (34),
     a measuring device (40), and
     an analysis unit (50),
   wherein
     the electrical component (10, 15) is connected between the input terminal (30) and the output terminal (35), the first voltage divider (20) is connected between the input terminal (30) and the reference potential terminal (34),
     the second voltage divider (25) is connected between the output terminal (32) and the reference potential terminal (34),
     the second switch (S2) is connected between the input terminal (30) and the output terminal (32),
     the first switch (S1) is
       connected between the input terminal (30) and a connection point of the first voltage divider (30) and the second switch (S2), or
       connected between the output terminal (32) and a connection point of the second voltage divider (25) and the second switch (S2),
     a first measurement connection (42) of the measuring device (40) is connected to a connection point of the third resistor (R3) and the fourth resistor (R4) of the second voltage divider (25),
     a second measurement connection (44) of the measuring device (40) is connected to a connection point of the first resistor (R1) and the second resistor (R2) of the first voltage divider (20),
     the measuring device (40) is configured to measure a voltage at the first measurement connection (42) and the second measurement connection (44), respectively, and to transmit a result of the respective measurements to the analysis unit (50), and
   the analysis unit (50) is configured to
     determine a corrective factor for a balance between the first voltage divider (20) and the second voltage divider (25) while the first switch (S1) is open and the second switch (S2) is closed by means of a control by the analysis unit (50),
     correct, using the corrective factor, a voltage difference between the first measurement input (42) and the second measurement input (44) of the measuring device (40), and
     determine a state of the electrical component (10, 15) based on an evaluation of a voltage difference corrected by the corrective factor between the first measurement input (42) and the second measurement input (44) of the measuring device (40), while the first switch (S1) is closed by means of a control by the analysis unit (50) and the second switch (S2) is open.

2. The monitoring assembly according to claim 1, wherein the first voltage divider (20) and the second voltage divider (25) are symmetrically constructed, and/or the monitoring assembly is configured to monitor voltages up to 800 V.

3. The monitoring assembly according to claim 1, wherein a frequency that the analysis unit (50) determines the corrective factor and/or a frequency that the measuring device (40) measures the voltage difference corrected by the corrective factor is based on
   a rate of change
   a voltage measured between the input terminal (30) and the reference potential terminal (34), and/or
   a current measured between the input terminal (30) and the output terminal (32), and/or
   a temperature of the electrical component (10, 15), and/or
   an aging of the electrical component (10, 15) is adapted.

4. The monitoring assembly according to claim 1, wherein in the event of a determined error state of the electrical component (10, 15), a fault treatment is initiated by means of the analysis unit (50), which in particular causes an electrical disconnection of the output terminal (32) from the input terminal (30).

5. The monitoring assembly according to claim 1, wherein the corrective factor is determined only when a current between the input terminal (30) and the output terminal (32) exceeds a predefined current threshold.

6. The monitoring assembly according to claim 1, wherein at least one resistor (R1, R2) of the first voltage divider (20) and/or at least one resistor (R3, R4) of the second voltage divider (25) is arranged outside an area range in which there is substantially uniform heating of the resistors of the two voltage dividers (20, 25) due to a substantially uniform ambient temperature.

7. The monitoring assembly according to claim 1, wherein the analysis unit is configured
   to always control the first switch (S1) and the second switch (S2) such that a short circuit between the input terminal (30) and the output terminal (32) is never produced via the first switch (S1) and the second switch (S2), and/or
   to open the first switch (S1) in response to detecting a sleep mode of a system using the monitoring assembly.

8. A semiconductor switch assembly with a monitoring function comprising a monitoring assembly according to claim 1, wherein
   the electrical component comprises a first semiconductor switch (10) having a first inverse diode and a second semiconductor switch (15) having a second inverse diode, and
   the first semiconductor switch (10) and the second semiconductor switch (15) are connected in series between the input terminal (30) and the output terminal (32) such that the first inverse diode and the second inverse diode are anti-serially connected, and are configured based on a control to enable an interruption of a current flow between the input terminal (30) and the output terminal (32).

9. The semiconductor switch assembly according to claim 8, wherein determining the state of the first semiconductor switch (10) and/or the second semiconductor switch (15) includes determining a short circuit present in the first semiconductor switch (10) and/or the second semiconductor switch (15), and/or a deviation of an actual switched state from a target switched state of the first semiconductor switch (10) and/or the second semiconductor switch (15).

10. The semiconductor switch assembly according to claim 8, wherein at least one further series circuit is connected from a third semiconductor switch (60) and a fourth semiconductor switch (65) in parallel to the series circuit from the first semiconductor switch (10) and the second semiconductor switch (15).

11. An energy system comprising:

a semiconductor switch assembly according to claim 8, a battery (70), in particular a vehicle battery, connected between the input terminal (30) and the reference potential terminal (34), and an electrical consumer (80), in particular an electrical consumer of a vehicle connected between the output terminal (32) and the reference potential terminal (34).

* * * * *